United States Patent
Lutz

(10) Patent No.: US 8,072,010 B2
(45) Date of Patent: Dec. 6, 2011

(54) MEMBRANE FOR A MEMS CONDENSER MICROPHONE

(75) Inventor: Josef Lutz, Rohrau (AT)

(73) Assignee: Knowles Electronics Asia PTE, Ltd., Singapore (SG)

( * ) Notice: Subject to any disclaimer, the term of this patent is extended or adjusted under 35 U.S.C. 154(b) by 1053 days.

(21) Appl. No.: 11/914,741

(22) PCT Filed: Apr. 25, 2006

(86) PCT No.: PCT/IB2006/051290
§ 371 (c)(1),
(2), (4) Date: Nov. 16, 2007

(87) PCT Pub. No.: WO2006/123263
PCT Pub. Date: Nov. 23, 2006

(65) Prior Publication Data
US 2008/0212409 A1    Sep. 4, 2008

(30) Foreign Application Priority Data
May 17, 2005    (EP) .................................. 05104093

(51) Int. Cl.
*H01L 29/84*    (2006.01)

(52) U.S. Cl. ........................................ 257/254; 257/416
(58) Field of Classification Search ................. 381/337, 381/417, 423, 424; 438/52, 53; 257/415–419, 257/E21.613, E29.324, 254
See application file for complete search history.

(56) References Cited

U.S. PATENT DOCUMENTS
5,146,435 A    9/1992    Bernstein et al.
2003/0133588 A1    7/2003    Pedersen

FOREIGN PATENT DOCUMENTS
EP    1398298 A2    3/2004
WO    03045110 A1    5/2003

*Primary Examiner* — Calvin Lee
(74) *Attorney, Agent, or Firm* — Steven McMahon Zeller, Esq.; Dykema Gossett, PLLC

(57) ABSTRACT

A membrane (2) for a microphone (1) is disclosed which comprises a first portion (A1), a second portion (A2), and elements (E1 ... E4, E1' ... E4'), which connect said first (A1) and said second portion (A2). The second portion (A2) is arranged for a movement in relation to said first portion (A1) around an idle position, which movement includes at least a translatory component in a direction of movement (dm) normal to said membrane (2). The elements (E1 ... E4, E1' ... E4') are provided for definition of a spring constant for said movement around said idle position and are arranged substantially along the outer border of said second portion (A2).

10 Claims, 4 Drawing Sheets

MEMBRANE FOR A MEMS CONDENSER MICROPHONE

FIELD OF THE INVENTION

The invention relates to a membrane for a microphone comprising a first portion, a second portion, and elements, which connect said first and said second portion, wherein said second portion is arranged for a movement in relation to said first portion in a direction of movement and around an idle position. Moreover the invention relates to a microphone comprising an inventive membrane.

BACKGROUND OF THE INVENTION

In principle, a condenser microphone comprises a thin membrane or diaphragm that is mounted in close proximity to a back plate. The thin membrane is fixed at its edges, so that it is able to deflect when sound pressure is acting on it. Together, the membrane and the back plate form an electric capacitor, where the capacitance changes according to said deflection of the membrane. In use, the capacitor will be charged using a DC voltage, usually called polarization or bias voltage. When the capacitance varies due to a varying sound pressure, an AC voltage that is proportional to the sound pressure will be superimposed on the DC voltage, which AC voltage is used as an output signal of the microphone.

The ever decreasing size of electronic devices has now lead to so-called MEMS (Micro Electro-Mechanical Systems) microphones, which mark a technical borderline what today is possible with respect to miniaturization of microphones. Those microphones have special requirements and need for special manufacturing processes. Micromachined microphones are usually developed for a lower voltage than standard microphones, normally for a voltage below 10V, which is why also the air gap is much smaller, usually less than 5 µm so as to obtain a sufficient field strength for an acceptable sensitivity of the microphone. However, the voltage cannot be increased to any value, because if the electric field strength exceeds a certain limit, the membrane snaps to the back plate which causes a short circuit. Of course this depends also on the stiffness of the membrane, which increases with thickness and Young's modulus of material used. On the other hand, smooth membranes at a high voltage are wanted for a high sensitivity or a low noise level respectively. Therefore designing a microphone means always finding the balance between a wanted sensitivity and the threatening collapse of the membrane. Hence the aforementioned concrete values for an air gap and a polarization voltage only serve as an example, just for illustration of the dimensions of a MEMS microphone.

FIG. 1a shows a cross section of a prior art MEMS microphone 1. First of all a silicon die 3 is coated with a conductive layer, which forms the membrane 2'. After this coating a cavity is etched into the die 3, thus freeing the membrane 2'. On top of this construction is placed a back plate 4 comprising holes 5, wherein an insulator 6 electrically separates the membrane 2' from the back plate 3. Optionally, the membrane 2' is made of an insulator. In this case a conductive layer on or under the membrane is used as an electrode. This conductive layer may also serve as an shielding against electromagnetic interference.

In use a polarization voltage is now applied to the membrane 2' and the conducting back plate 3, thus mechanically preloading and therefore bending the membrane 2'. The bold-line membrane 2' in FIG. 1b indicates the idle position IDL after biasing the system by means of a polarization voltage. Varying air pressure in front of or behind the membrane 2' caused by sound waves leads to a further bending of the membrane 2'. Thin lines indicate the upper and lower dead center UDC and LDC of the membrane 2' for a given sound pressure. It should be noted that there is no translatory movement involved. The three positions of the membrane 2' are separated for better visualization. In reality the outer area of the membrane is fixed and does not move so that there is only a bending within the membrane 2'.

The holes 5 in the back plate 3 serve as a necessary ventilation. Otherwise the up-moving membrane 2' would compress the air between membrane 2' and back plate 3, which would hinder the movement of the membrane 2'.

This prior art construction has some drawbacks: First, a certain stress within the membrane 2' is a result of the production process. Unfortunately, this stress is neither predictable nor adjustable so that the idle position of the membrane 2' is unknown as well. As a consequence, there is a great spread of the sensitivity across a couple of different microphones. Therefore the membrane 2' may have a couple of small holes in the outer area, thereby decreasing the stress within the membrane 2'. FIG. 2a shows a top view of such a membrane 2', wherein in the upper left corner the back plate 4 with holes 5 and in the lower right corner the membrane 2' with holes 7 is shown. FIG. 2b shows an corresponding cross sectional view B, B' of the microphone 1 which is quite similar to the one shown in FIGS. 1a and 1b. Of course the size of the holes 7 may not exceed a certain diameter because otherwise the ventilation through these holes 7 is too high, thereby decreasing the sensitivity of the microphone 1. In some solutions therefore these holes 7 are sealed again with a different material, which does not influence the stress within the membrane 2' but only closes the holes 7.

Second, due to the construction the membrane 2' only bends when different air pressures acts on it. Hence the center area contributes much more to an AC signal than the outer areas, which are more or less wasted.

OBJECT AND SUMMARY OF THE INVENTION

It is now an object of the invention to provide a membrane of the type mentioned in the first paragraph and a microphone of the type mentioned in the second paragraph which obviate the drawbacks described hereinbefore.

To achieve the object described above, a membrane as descried in the opening paragraph is disclosed,
  wherein said second portion is arranged for a movement in relation to said first portion around an idle position, which movement includes at least a translatory component in a direction of movement normal to said membrane,
  wherein said elements are arranged substantially along the outer border of said second portion, and
  wherein said elements are provided for definition of a spring constant for said movement around said idle position.

In this way an improvement of the sensitivity of a microphone is achieved by two synergetic effects. First, due to said substantially translatory movement of said second portion, the sensitivity is dramatically increased because not only the center area of a membrane significantly contributes to an AC signal but also the outer areas. The term "at least including a translatory component" in the context of the present invention does neither exclude a certain rotation or a certain tilting of the membrane nor a certain bending of the membrane. Applying a differential pressure to a membrane always leads to a certain amount of bending, but for an inventive membrane this is not essential or at least not the only effect. The second portion of a membrane may rather be made quite thick and therefore mechanically stable. Hence variations in the coating process do not significantly influence the mechanical behavior of the membrane, which in contrast was the case of comparable thin prior art membranes. As a rotation around the normal axis of the membrane does not influence the capacity of the microphone, such a movement is negligible for a inventive membrane. However, this statement will be put in perspective, later for non-circular second areas. Tilting may also occur when using membranes. However, this effect should also be held at a certain limit as again certain areas of the membrane significantly contribute more to an AC signal than others.

The second effect, which dramatically increases the sensitivity is the special arrangement of the elements connecting the first and the second area. Usually such elements—if existing—radially project from the second area to the first area. This for example is the case for the arrangement of FIG. 2a, when the parts between the holes are interpreted as elements connecting the first and the second area. A further example is shown in US 2003/0133588, dated Jul. 17, 2003. Here said elements project radially from the corners of said second area.

However, WO 2003/045110, dated May 30, 2003 discloses tangentially arranged elements connecting a first and a second area of a membrane, but said elements are not provided for definition of a spring constant for a translatory movement of the membrane around an idle position. By means of a biasing voltage the membrane is pulled onto bumps, which define an air gap between membrane and back plate. When sound pressure is applied to the membrane, it bends, similarly to the membrane shown in FIG. 1b.

The term "substantially along the outer border" in the context of the present invention however means, that significant sections of the elements are arranged parallel to the second portion or at an angle which does not significantly deviate from the tangential direction. Preferably this angle is less than 45°. More preferably the angle is less than 30°. Still more preferably the angle is less than 10°. "Significant sections" means preferably more than 50% of the total length of one element. More preferably more than 70% of the total length of one element is meant. Most preferably more than 90% of the total length of one element is meant.

Concluding the present invention offers a membrane which provides a maximum output signal at minimum size of the membrane.

It is of particular advantage, when said elements are additionally provided for a definition of a planar tensile and/or compression stress within said second portion in said idle position. Here the elements, in particular arms tangentially projecting from said second portion, are provided for definition of a spring constant for a movement normal to the membrane and for a definition of a planar tensile and compression stress within said second portion in said idle position. The former by bending in a direction normal to the membrane, the latter by bending within the plane of the membrane. By variation of height, width and length of the arms both functions may independently be achieved. A more complex behavior may be achieved by giving the elements a special shape.

It is advantageous, when the membrane comprises at least three connecting elements. In this way a more or less translatory movement of the membrane may be achieved. At least the tendency to tilt is significantly reduced. But it should be noted at this point that the invention is related to any number of connecting elements.

It is further advantageous, when said elements are spirally arranged. "Spiral" in the inventive context does not only apply to circular structures but rather to any shape of the second area of the membrane, meaning that all elements are arranged in the same way, or in other words: all elements project clockwise or counterclockwise. A movement of the second portion in the direction of movement therefore always comprises a rotational component, since the projection of the elements on the plane of the first portion is shortened upon said movement as the elements are bent. So in total the second portion moves according a screwing movement. It should be noted at this point, that again a bending of the membrane or the second portion respectively is not excluded.

It is further of advantage, when at least one element is symmetrically shaped or at least one element is inversely arranged with respect to the other spirally arranged elements. This measure significantly or completely reduces a membrane's tendency to rotate. Such a rotation obviously occurs when a membrane with exclusively spirally arranged elements is excited. This is a minor problem when the free space between the first area and said elements and between the second area and said elements is comparably big and for more or less circular second areas, but might be a major problem for small structures as small slits dramatically reduce the membrane's possibility to rotate.

Yet another advantageous embodiment of an inventive membrane is achieved, when it consists of a semiconductor. Manufacture of semiconductor layers is a well known process. Hence a membrane is comparably easy to produce.

It is of particular advantage, when said first portion, said second portion, and said elements exclusively consist of rectangular structures and said structures are in line with a crystal lattice of said semiconductor. Because of the crystal lattice, rectangular structures should be preferred as they are easier to etch. Hence the structures of the membrane should be in line with a crystal lattice of the semiconductor.

Yet another advantageous embodiment of the invention is achieved with a membrane, wherein said first portion, said second portion, and said elements exist of a flat die of the same material with substantially the same thickness. In this way simply a layer of constant thickness has to be put onto the substrate. The shape of the membrane is finally made through etching. Also for the etching process a constant thickness of the layer is advantageous since the etching process takes the same time for all structures.

It is further advantageous when between said first portion, said second portion, and said elements there are slits, which are provided as a gasket. Since the free space between the first area and said elements and between the second area and said elements in principle allows for ventilation, its size should not exceed a certain limit. Said slits in general form a high pass for the arriving sound waves, because slow changes of air pressure are equalized unhindered by said slits, whereas the slits act as a barrier for fast changes. The thinner the slits are the higher the resistance against ventilation is. Therefore the size of the slits may be chosen according a desired characteristic of the membrane or the microphone respectively. Assuming a non rotating membrane, these slits have the same cross section for ventilation over the movement of the membrane. Therefore the fluidic friction within said slits linearly changes with the amplitude of the membrane, as the length of the slits for the ventilating air changes.

Finally it is advantageous when the maximum amplitude, which the membrane is arranged for, is less than the thickness of the membrane. To avoid a dramatic increase of the cross section of said slits and in turn a significant change of the aforementioned high-pass characteristic, the maximum amplitude of the membrane should not exceed the membrane's thickness. The lower the amplitude in relation to the thickness of the membrane the lower the influence on the acoustic behavior. However the sensitivity of the microphone at a certain frequency depends on the sound pressure anyway, because of the physical context stated before. Assuming that the membrane does not significantly bend when a differential air pressure is applied, the maximum amplitude of the membrane at a certain differential air pressure or a certain sound pressure respectively depends on the stiffness of the elements connecting the first and second area of the membrane.

At this point it should be noted that various embodiments of a membrane as well as advantages stated for the membrane as well apply to an inventive microphone comprising an inventive membrane. These and other aspects of the invention are apparent from and will be elucidated with reference to the embodiments described hereinafter.

BRIEF DESCRIPTION OF THE DRAWINGS

The invention will be described in greater detail hereinafter, by way of non-limiting example, with reference to the embodiments shown in the drawings.

FIG. 1b shows the bending of the membrane of FIG. 1a;
FIG. 2b shows the cross sectional view of the membrane of FIG. 2a.

Figure 1A:
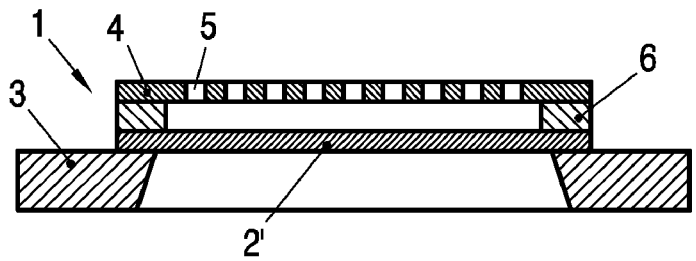
FIG. 1a shows a cross sectional view of a prior art MEMS condenser microphone.

The Figures are schematically drawn and not true to scale, and the identical reference numerals in different figures refer to corresponding elements. It will be clear for those skilled in the art that alternative but equivalent embodiments of the invention are possible without deviating from the true inventive concept, and that the scope of the invention will be limited by the claims only.

DESCRIPTION OF EMBODIMENTS

Figure 1B:
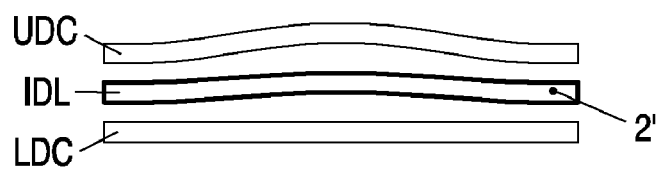
Figure 2A:
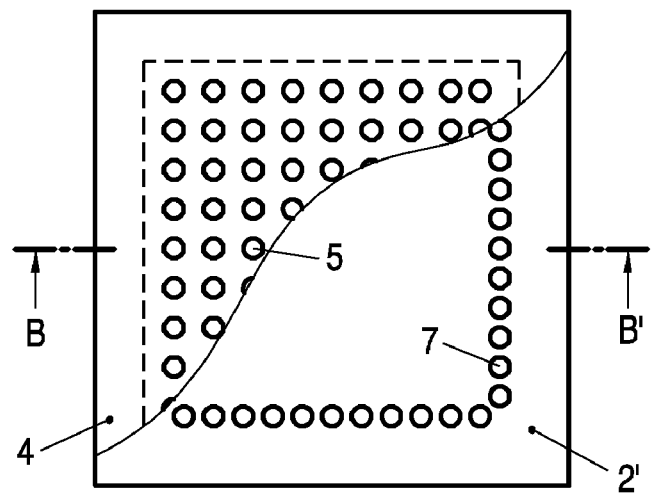
FIG. 2a shows a top view of a prior art membrane with stress release structures.
Figure 2B:
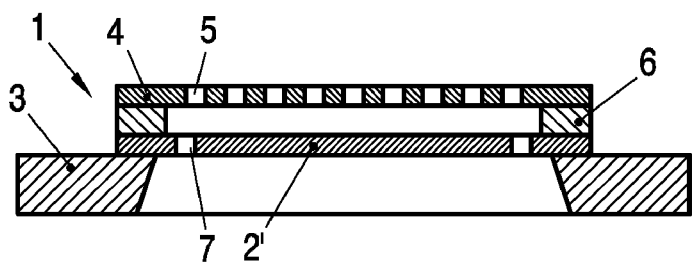
Figure 3A:
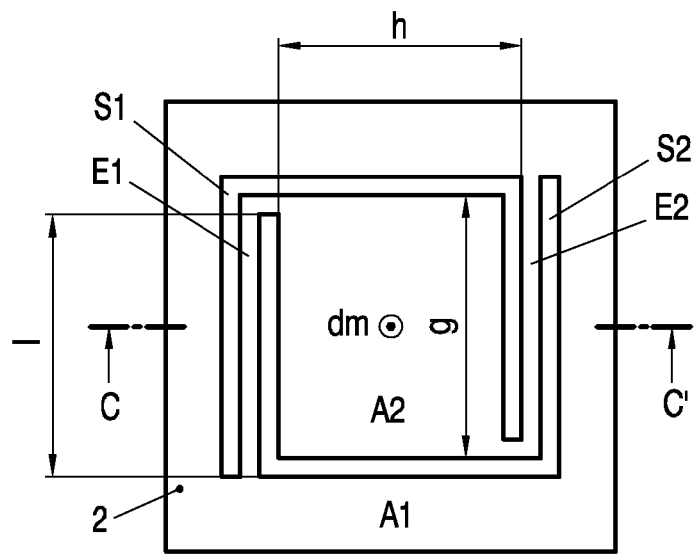
FIG. 3a shows an inventive membrane with two spiral connecting elements.

FIG. 3a shows a top view of a first embodiment of an inventive membrane 2, comprising first portion A1, second portion A2, and two elements E1, E2, having an effective length l, which connect said first A1 and said second portion A2. The two elements E1, E2 are spirally arranged and project counterclockwise from the second portion A2. The second portion A2 has the width g and the length h. The structure is manufactured by etching two U-shaped slits S1 and S2, which free the second portion A2 from the first portion A1 and at the same time form the two elements E1, E2. It can easily be seen that the significant sections of the elements E1, E2 are arranged parallel to the second portion A2. Finally the direction of movement dm is shown in FIG. 1 which normally projects from the planar membrane 2.

Figure 3B:
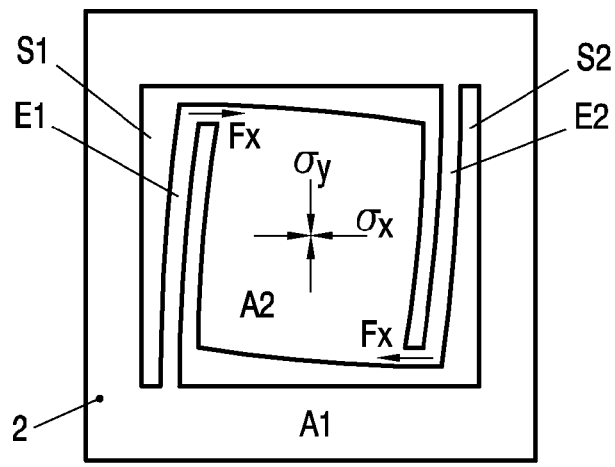
FIG. 3b shows the membrane of FIG. 3a after stress release.

FIG. 3b shows the membrane 2 of FIG. 3a after the etching of the two slits S1, S2 when a planar tensile stress in x-direction σx and in y-direction σy, indicated with arrows, is within the membrane 2. At the time the second portion A2 is freed from the first portion A1, the second portion A2 as well as the two elements E1, E2 are deformed as shown, because the structure becomes smaller due to inner stress (see also forces Fx in x-direction acting on the elements E1, E2). At the same time the second portion A2 is turned against the first portion A1. The planar tensile stress σx, σy is therefore reduced to a certain limit, which depends on the mechanical stiffness of the two elements E1, E2. Because the stiffness of the elements E1, E2 is well determined by the shape of the elements E1, E2 said limit may easily be determined. Simply speaking, the shorter and thicker the elements E1, E2 are the stiffer they are and the higher the stress limit is. Because the etching process, which forms the two slits S1, S2, is well under control the mechanical and therefore acoustic behavior of the membrane 2 is highly reproducible.

Figure 3C:
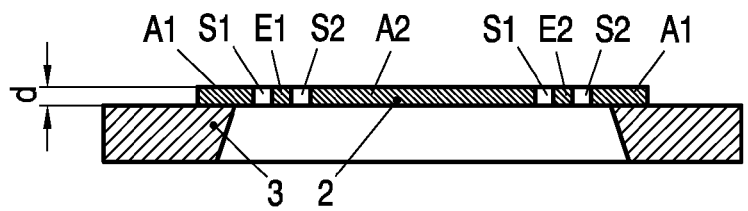
FIG. 3c shows the cross section of the membrane of FIG. 3a in idle position.

FIG. 3c now shows the cross sectional view C, C' of the membrane 2 of FIG. 3a on a die 3 in an idle position. Back plate and insulation are omitted for the sake of brevity. As can easily be seen, the membrane 2 consists of a layer of constant thickness d.

Figure 3D:
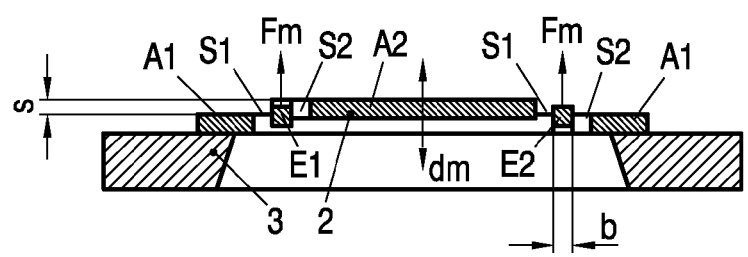
FIG. 3d shows the cross section of the membrane of FIG. 3a in excited position.

FIG. 3d shows the cross sectional view C, C' of the membrane 2 of FIG. 3a on a die 3 in an excited position. The second portion A2 has moved upwards in direction of movement dm by the amplitude s. The two elements E1, E2, which have the width b, are therefore bent upwards as well (see also forces Fm in direction of movement dm acting on the ends of the elements E1, E2). The spring constant in direction of movement dm is again well defined by the shape of the two elements E1, E2. The shorter and thicker the elements E1, E2 are the higher the spring constant is. When the second portion A2 moves in direction of movement dm, the projection of the elements E1, E2 on the plane of the first portion A1 is shortened. Hence, with the translatory movement of the second portion A2 in direction of movement dm in hand a rotation around the normal axis occurs. Furthermore the second portion A2 may bend upwards to a certain extent because of the air pressure. However, this effect is not shown in FIG. 3d as it is assumed that the second portion A2 is comparably stiff. Finally, the second portion A2 may easily tilt, as it is supported only in 2 points.

In the following an approximation is calculated for the spring constant in direction of movement dm and for the resulting planar tensile and/or compression stress σx, σy within the second portion A2 of the membrane 2. In both cases it is assumed that the elements E1, E2 act as simple bending bars. For the calculation of the spring constant the bending of one element E1, E2, and therefore the amplitude s for the second portion A2 is defined as:

$$s = \frac{F_m \cdot l^3}{3 \cdot E \cdot I}$$

wherein Fm is the force in direction of movement causing the bending, l is the effective length of one element E1, E2, E is the Young's modulus of the material used and I is the relevant moment of inertia of one element E1, E2. The spring constant is defined as the ratio between force Fm caused by both elements E1, E2 and the amplitude s:

$$\frac{F_m}{s} = \frac{6 \cdot E \cdot I}{l^3}$$

For a movement in direction of movement dm, the corresponding moment of inertia is:

$$I = \frac{b \cdot d^3}{12}$$

and therefore the spring constant for a movement in direction of movement dm is obtained as follows:

$$\frac{F_m}{s} = \frac{E \cdot b \cdot d^3}{2 \cdot l^3}$$

In the following the resulting planar tensile stress within the second portion A2 is calculated, wherein as a rough approximation only stress in x-direction σx is considered, which is defined as follows:

$$\sigma_x = \sigma_0 - E \cdot \frac{\Delta h}{h}$$

wherein h is the extension of the second portion A2 in x-direction, Δh is its shortening, $\sigma_0$ is the inner stress in x-direction before etching the slits S1, S2 and σx is the stress in x-direction after releasing the second portion A2. Hence the equation for the shortening Δh is obtained as follows:

$$\Delta h = (\sigma_0 - \sigma_x) \cdot \frac{h}{E}$$

Half of the total shortening Δh equals the bending of one element E1, E2 in x-direction.

$$\frac{\Delta h}{2} = (\sigma_0 - \sigma_x) \cdot \frac{h}{2 \cdot E} = \frac{F_x \cdot l^3}{3 \cdot E \cdot I}$$

The force acting on one element E1, E2 in x-direction is $$F_x = \sigma_x \cdot g \cdot d$$

and therefore the following equation is obtained:

$$(\sigma_0 - \sigma_x) \cdot \frac{h}{2 \cdot E} = \frac{\sigma_x \cdot g \cdot d \cdot l^3}{3 \cdot E \cdot I}$$

$$\sigma_0 \cdot \frac{h}{2 \cdot E} - \sigma_x \cdot \frac{h}{2 \cdot E} = \sigma_x \cdot \frac{g \cdot d \cdot l^3}{3 \cdot E \cdot I}$$

$$\sigma_0 \cdot h = \sigma_x \cdot \left( \frac{2 \cdot g \cdot d \cdot l^3}{3 \cdot I} + h \right)$$

$$\sigma_x = \sigma_0 \cdot \frac{h}{\frac{2 \cdot g \cdot d \cdot l^3}{3 \cdot I} + h} = \sigma_0 \cdot \frac{1}{1 + \frac{2 \cdot g \cdot d \cdot l^3}{3 \cdot I \cdot h}}$$

The relevant moment of inertia is $$I = \frac{d \cdot b^3}{12}$$

and therefore the stress in x-direction follows as:

$$\sigma_x = \sigma_0 \cdot \frac{1}{1 + \frac{8 \cdot g \cdot l^3}{b^3 \cdot h}}$$

It is obvious that the inner stress σx is reduced because the divisor of the fraction is always greater than 1. By opposing the formula for the spring constant in direction of movement and the resulting planar tensile and/or compression stresses are defined as follows:

$$\frac{F_m}{s} = \frac{E \cdot b \cdot d^3}{2 \cdot l^3} \qquad \sigma_x = \sigma_0 \cdot \frac{1}{1 + \frac{8 \cdot g \cdot l^3}{b^3 \cdot h}}.$$

One skilled in the art furthermore easily realizes, that there are independent parameters for independent definitions of spring constant Fm/s and stress σx. However, the formulas above only show a rough approximation. In reality tension, compression, bending, shearing and torsion may be superimposed on the elements E1, E2 or on the second portion A2 respectively, thereby complicating the correct calculation of the mechanical loads. Therefore, it might be useful to use a computer model based on the finite elements method for said calculation.

Figure 4:
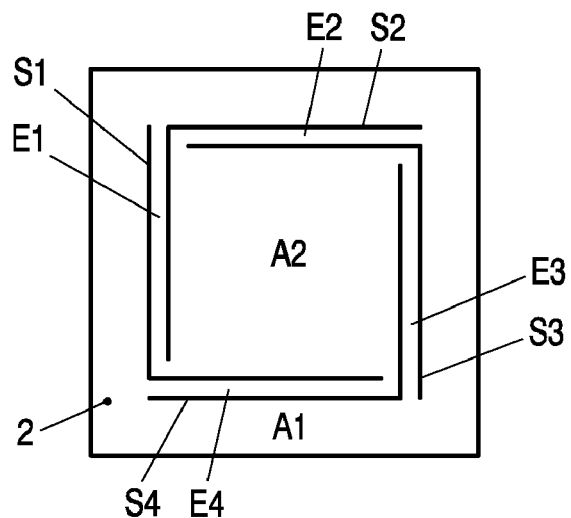
FIG. 4 shows an inventive membrane with four spiral connecting elements.

FIG. 4 shows another embodiment of an inventive membrane 2, comprising a first portion A1, a second portion A2, and four elements E1 . . . E4, which connect said first A1 and said second portion A2. In this example the four elements E1 . . . E4 are spirally arranged and project clockwise from the second portion A2. Again the structure is made by etching slits, in this case four slits S1 . . . S4. In this and in the further figures the slits are presumed to be comparably small, which is why they are shown only in single lines.

Figure 5:
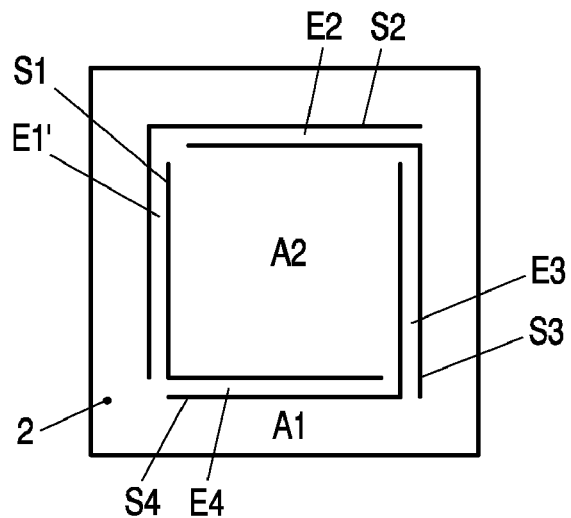
FIG. 5 shows a membrane with an inversely arranged connecting element.

FIG. 5 shows an embodiment of a membrane 2 which is quite similar to the one shown in FIG. 4. The only difference is that the first element E1' is inversely arranged to the other elements E2 . . . E3, in other words: it projects counterclockwise from the second portion A2. Thereby the tendency of the second portion A2 to rotate when it moves in direction of movement dm is dramatically decreased, which in turn leads to more or less constant conditions for the ventilating air.

Figure 6:
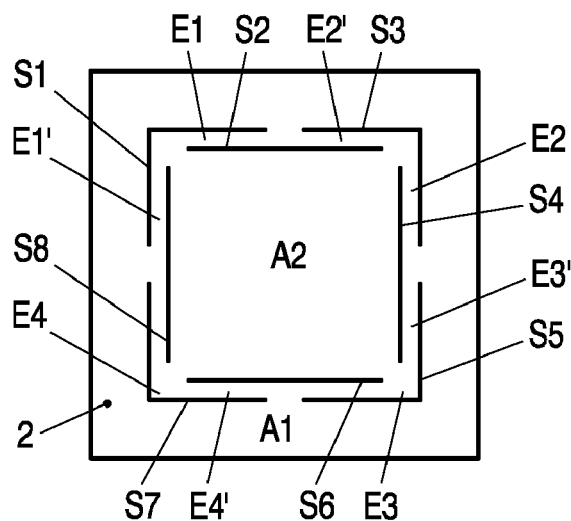
FIG. 6 shows a membrane with symmetrically shaped connecting elements.

FIG. 6 shows yet another embodiment of a membrane 2. Here the first portion A1 and the second portion A2 are connected by four elements E1 . . . E4, projecting clockwise from the second portion A2, and by four elements E1' . . . E4', projecting counterclockwise from the second portion A2. In this way a rotation of the second portion A2 upon a movement in direction of movement dm is avoided. The structure is made by eight slits S1 . . . S8. It should be noted that a pair of elements across the corner (e.g. E1 and E1') or on the long side (e.g. E1' and E2) can also be seen as a single symmetrically shaped element.

Figure 7:
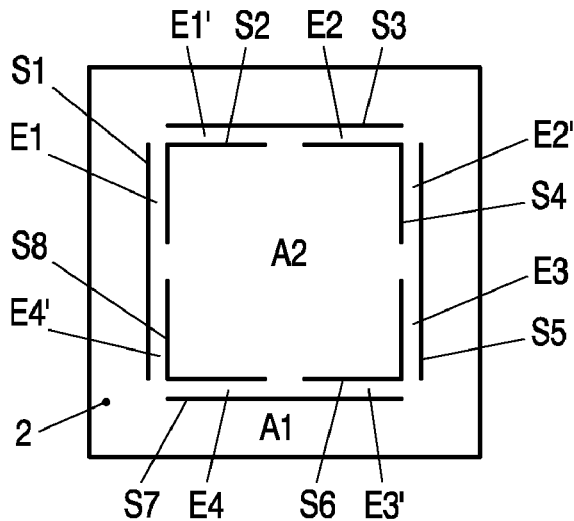
FIG. 7 shows another membrane with symmetrically shaped connecting elements.

FIG. 7 shows an embodiment of a membrane 2 which is quite similar to the one shown in FIG. 6. the only difference is that the straight slits S1, S3, S5, S7 are now arranged outside the L-shaped slits S2, S4, S6, S8 in contrast to the embodiment of FIG. 6.

Figure 8:
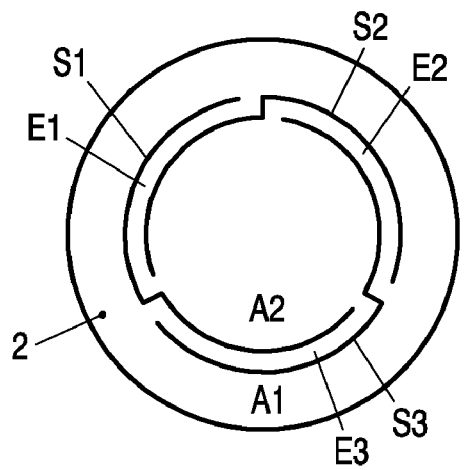
FIG. 8 shows a circular inventive membrane.

FIG. 8 now shows that the invention also applies to a circularly shaped membrane 2. Here the first portion A1 and the second portion A2 are connected by three elements E1 . . . E3 projecting clockwise from the second portion A2. The elements E1 . . . E3 are shifted each by 120°. Three slits S1 . . . S3 are necessary to etch the shown structure. A rotation of the second portion A2 upon a movement in direction of movement dm is less troubling in this special case due to circular structures, meaning that the structure does not have corners which might hit against the edges of the slits.

Figure 9:
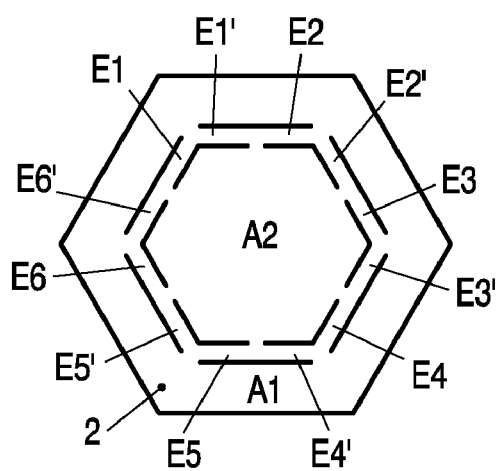
FIG. 9 shows a hexagonal inventive membrane.

Finally FIG. 9 shows that the invention also applies to polygon-shaped structures. In the FIG. 9 a hexagonal membrane 2 is shown. Here the first portion A1 and the second portion A2 are connected by six elements E1 . . . E6, projecting clockwise from the second portion A2, and by six elements E1' . . . E6', projecting counterclockwise from the second portion A2. In this way a rotation of the second portion A2 upon a movement in direction of movement dm again is avoided. The slits are not marked by reference signs for the sake of brevity here. Again a pair of elements across a corner (e.g. E1 and E1') or on the long side (e.g. E1' and E2) can be seen as a single symmetrically shaped element.

It should be noted that the invention—although symmetrical embodiments are shown in the Figures—of course also applies to elongated shapes. So the scope of the invention does not only cover membranes or second portions respectively which are squares, circles or isosceles polygons but also generic rectangles, ellipses or irregular polygons. The choice of a certain shape will often depend on the purpose as well as on the free space in a device, which is reserved for the inventive microphone.

It should finally be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A membrane for a microphone comprising:
   a first portion, a second portion, and elements which connect said first and said second portion;
   wherein said second portion is arranged for a movement in relation to said first portion around an idle position, which movement includes at least a translatory component in a direction of movement normal to said membrane;
   wherein said elements are arranged substantially along the outer border of said second portion; and
   wherein said elements are provided for definition of a spring constant for said movement around said idle position.

2. The membrane as claimed in claim 1, wherein said elements are additionally provided for a definition of a planar tensile and compression stress within said first portion in said idle position.

3. The membrane as claimed in claim 1, comprising at least three elements.

4. The membrane as claimed in claim 1, wherein said elements are spirally arranged.

5. The membrane as claimed in claim 1, wherein at least one element is symmetrically shaped or wherein at least one element is inversely arranged to the other spirally arranged elements.

6. The membrane as claimed in claim 1, which consists of a semiconductor, wherein said first portion, said second portion, and said elements exclusively consist of rectangular structures and wherein said structures are in line with a crystal lattice of said semiconductor.

7. The membrane as claimed in claim 1, wherein said first portion, said second portion, and said elements exist of a flat die of the same material with substantially the same thickness.

8. The membrane as claimed in claim 1, wherein between said first portion, said second portion, and said elements there are slits, which are provided as a gasket.

9. The membrane as claimed in claim 1, wherein the maximum amplitude which the membrane is arranged for is less than the thickness of the membrane.

10. Microphone comprising a membrane as claimed in claim 1.

* * * * *